(12) United States Patent
Gorrell et al.

(10) Patent No.: US 6,811,714 B1
(45) Date of Patent: Nov. 2, 2004

(54) MICROMACHINED COMPONENT AND METHOD OF MANUFACTURE

(75) Inventors: Jonathan F. Gorrell, Pompano Beach, FL (US); Gordana S. Nielsen, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 450 days.

(21) Appl. No.: 09/680,777

(22) Filed: Oct. 6, 2000

(51) Int. Cl.$^7$ ................................................. C23F 1/00
(52) U.S. Cl. ................ 216/2; 216/57; 216/95; 34/337; 34/381; 252/79.3; 252/79.4
(58) Field of Search ............................ 216/2, 57, 95; 34/337, 343, 381, 413; 252/79.3, 79.4; 428/523

(56) References Cited

U.S. PATENT DOCUMENTS

| | | | | |
|---|---|---|---|---|
| 5,403,665 A | * | 4/1995 | Alley et al. ................. | 428/447 |
| 5,541,234 A | * | 7/1996 | Unger et al. ................. | 521/66 |
| 5,545,291 A | * | 8/1996 | Smith et al. ................ | 438/107 |
| 5,548,159 A | * | 8/1996 | Jeng ........................... | 257/634 |
| 6,168,694 B1 | * | 1/2001 | Huang et al. .......... | 204/290.12 |
| 6,404,028 B1 | * | 6/2002 | Hetrick et al. .............. | 257/415 |
| 6,524,429 B1 | * | 2/2003 | Nogami et al. ........ | 156/345.11 |
| 6,554,507 B2 | * | 4/2003 | Namatsu ..................... | 396/611 |
| 6,555,945 B1 | * | 4/2003 | Baughman et al. ......... | 310/300 |
| 6,565,763 B1 | * | 5/2003 | Asakawa et al. ............ | 216/56 |

FOREIGN PATENT DOCUMENTS

DE      195 06 404 C1      3/1996

OTHER PUBLICATIONS

Maboudian and Howe in J. Vac. Sci. Technol. B 15(1) Jan./Feb. 1997, pp. 1–20.*
Gregory Mulhern et al., "Supercritical Carbon Dioxide Drying of Microstructures", The 7th Int'l Conference on Solid–State Sensors and Actuators—Digest of Technical papers, Jun. 7–10, 1993, pp. 296–299.
Paul, O. et al.; Sacrificial Aluminum Etching for CMOS Microstructures;pp. 523–528; 0–7803–3744–1/97; IEEE.
Roger T. Howe; Applications of Silicon Micromachining to Resonator Fabrication; IEEE International Frequency Control Symposium; 1994; pp. 2–7; 0–7803–1945–1/94; IEEE.
International Search Report.

* cited by examiner

Primary Examiner—Allan Olsen

(57) ABSTRACT

A method of manufacturing a micromachined component includes using a first liquid to etch a first layer (140) located underneath a second layer (150), exposing the second layer to a second liquid that is inorganic and miscible in carbon dioxide, and supercritical drying the micromachined component with carbon dioxide.

14 Claims, 2 Drawing Sheets

MICROMACHINED COMPONENT AND METHOD OF MANUFACTURE

FIELD OF THE INVENTION

This invention relates to electronics, in general, and to micromachined components and methods of manufacture, in particular.

BACKGROUND OF THE INVENTION

The manufacturing of a micromachined component includes the removal of a sacrificial layer underneath an electrically conductive and/or structural layer. The removal of the sacrificial layer typically involves the use of a wet or liquid acid etchant in an acid hood. The micromachined component needs to be dried after the removal of the sacrificial layer because of the use of the liquid acid etchant to remove the sacrificial layer.

One technique for drying a micromachined component involves the use of a supercritical carbon dioxide drying process. This particular drying process reduces or eliminates release stiction in the micromachined component. After removing the sacrificial layer and before performing the supercritical carbon dioxide drying process, the micromachined component is immersed in methanol, which is an organic solvent.

The use of methanol, however, creates a problem in manufacturing the micromachined component because organic solvents are not permitted in an acid hood. Therefore, after the sacrificial layer is removed by the liquid acid etchant in the acid hood, the micromachined component is transported to a solvent hood in which the component is rinsed with methanol. The transportation of the component between hoods decreases the manufacturing throughput and also increases the cost of the manufacturing process.

Accordingly, a need exists for a method of manufacturing an electronic component and the resultant component thereof where the manufacturing process for the micromachined component maintains a high throughput and low cost while eliminating or at least reducing release stiction.

BRIEF DESCRIPTION OF THE DRAWINGS

The invention will be better understood from a reading of the following detailed description, taken in conjunction with the accompanying drawing figures in which.

Figure 1:
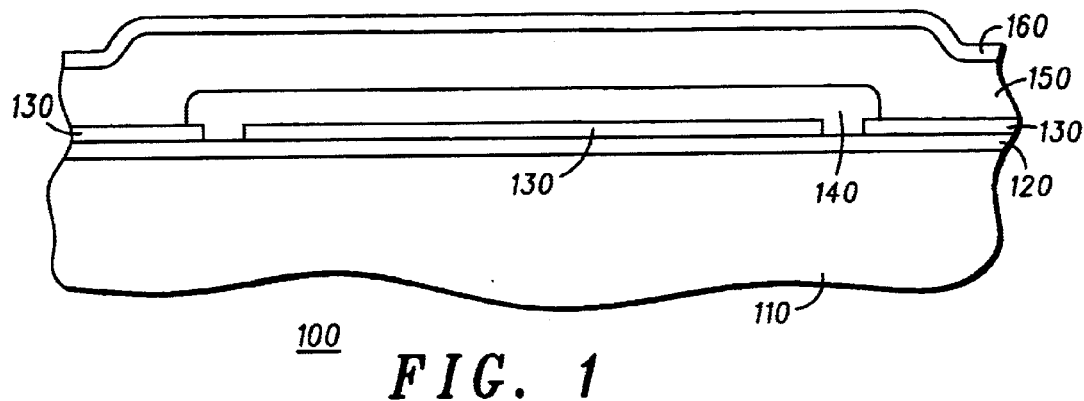
FIGS. 1 through 3 illustrate cross-sectional views of a portion of a micromachined component after different steps of a manufacturing process in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, fourth, fifth and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in sequences other than described or illustrated herein.

Moreover, the terms top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in orientations other than described or illustrated herein.

DETAILED DESCRIPTION OF THE DRAWINGS

Figure 2:
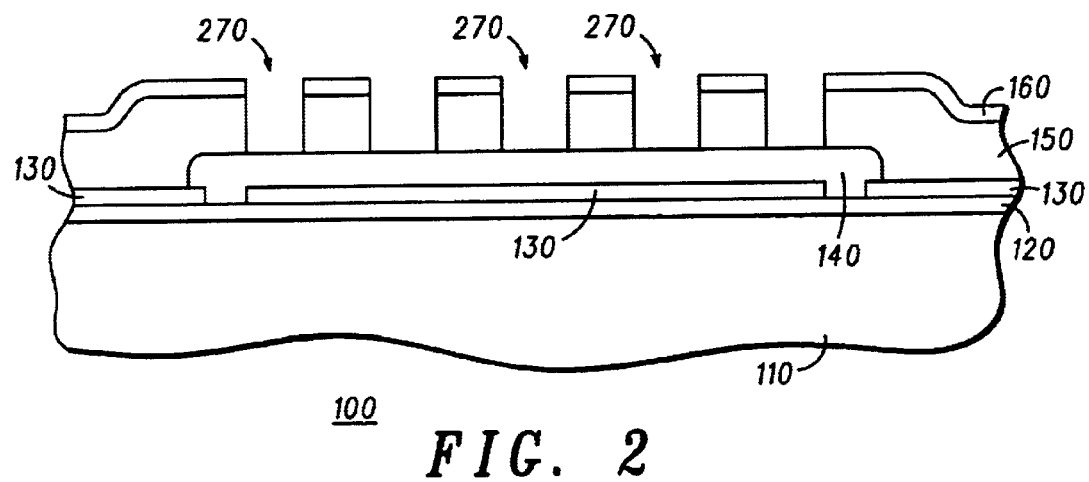
Figure 3:
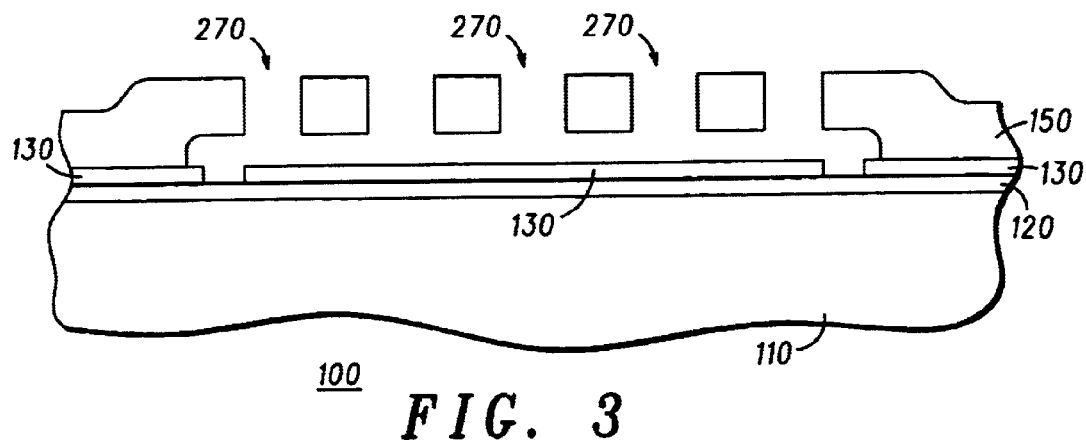

FIGS. 1 through 3 illustrate cross-sectional views of a portion of a micromachined component 100 after different steps of a manufacturing process. As an example, micromachined component 100 can be a sensor such as an accelerometer. In a different embodiment, component 100 can be used for biochip or communications applications.

The manufacturing process for component 100 preferably includes using a first non-solvent liquid to etch a sacrificial layer located underneath an electrically conductive and/or structural layer, exposing the electrically conductive and/or structural layer to a second non-solvent liquid that is miscible in carbon dioxide, and supercritical drying component 100 with carbon dioxide. The elimination of the use of an organic solvent such as methanol simplifies the manufacturing process for component 100 because component 100 does not need to be transferred from an acid hood, in which the sacrificial layer is removed, to a solvent hood. Instead, component 100 can remain in the acid hood after the sacrificial layer is removed, while the electrically conductive and/or structural layer is exposed to the second liquid, until just before component 100 is supercritical dried.

Turning to FIG. 1, component 100 is illustrated to include a substrate 110. Substrate 110 can include a semiconductor, metal, and dielectric layers. In the preferred embodiment, substrate 110 is a semiconductor substrate.

Component 100 also includes an electrically insulative layer 120 overlying substrate 110. When substrate 110 is comprised of a semiconductor layer, layer 120 electrically isolates substrate 110 from the portions of component 100 located over layer 120. Furthermore, when substrate 110 is comprised of a semiconductor layer and when other portions of component 100 located over layer 120 are also comprised of semiconductor layers, layer 120 serves as an etch stop layer to protect substrate 110. As an example, layer 120 can be comprised of silicon nitride, aluminum nitride, or silicon dioxide. In the preferred embodiment, layer 120 is comprised of silicon nitride.

An electrically conductive and/or structural layer 130 is formed over layer 120 and substrate 110. Layer 130 is patterned to provide a bottom capacitor electrode for micromachined component 100. As an example, layer 130 can be comprised of a doped semiconductor material, a metal, or another electrically conductive material. In the preferred embodiment, layer 130 is comprised of heavily doped silicon.

Next, a sacrificial layer 140 is formed over layer 130, layer 120, and substrate 110. Layer 140 is subsequently removed to release a top capacitor electrode of component 100. As an example, layer 140 can be comprised of silicon dioxide, Phospho-Silicate-Glass (PSG), or germanium. In the preferred embodiment, layer 140 is comprised of PSG.

Subsequently, an electrically conductive and/or structural layer 150 is formed over layer 140, layer 130, layer 120, and substrate 110. A portion of layer 150 forms the top capacitor electrode for component 100. As an example, layer 150 can be comprised of a doped semiconductor material, a metal, or another electrically conductive material. In the preferred embodiment, layer 150 comprises the same material as layer 130.

Next, an optional electrically insulative layer 160 can be formed over layers 150, 140, 130, and 120, and substrate 110. Layer 160 can be used to protect layer 150 when patterning an electrically conductive and/or structural layer (not shown in FIG. 1) overlying layer 150. As an example, layer 160 can be comprised of silicon dioxide, PSG, or silicon nitride.

Turning to FIG. 2, layers 160 and 150 are patterned. During this patterning process, holes 270 are etched into layers 160 and 150. Holes 270 expose portions of layer 140.

Subsequently, as illustrated in FIG. 3, layer 140 (FIG. 2) is etched and removed using a sacrificial etch process. This sacrificial etch process may also remove layer 160 (FIG. 2) as illustrated in FIG. 3. The removal of layer 140 (FIG. 2) releases the top electrode portion of layer 150 such that the released portion of layer 150 is movable relative to layers 130 and 120 and substrate 110.

A first liquid is used to etch layer 140 (FIG. 2). In an embodiment where layer 140 is comprised of silicon dioxide or PSG, the first liquid can be comprised of hydrofluoric acid, which is not a solvent. In this embodiment, the sacrificial etching process can be performed in an acid hood. In an embodiment where layer 140 is comprised of germanium, the first liquid can be comprised of hydrogen peroxide. In this embodiment, the sacrificial etching process can also be performed in an acid hood. The use of hydrofluoric acid or hydrogen peroxide enables the removal of layer 140 without substantially etching either of layers 130 or 150 when layers 130 and 150 consist essentially of doped silicon.

After etching or removing layer 140 (FIG. 2), layer 150 in FIG. 3 is exposed to a second liquid. This second liquid displaces the first liquid from between layers 150 and 130. In the preferred embodiment, especially where the first liquid is comprised of hydrofluoric acid, the second liquid completely displaces or completely removes the first liquid from component 100. The removal of the first liquid from component 100 terminates the etching process. Layer 150 can be exposed to the second liquid while component 100 remains in the acid hood. The first liquid is preferably miscible in the second liquid. As an example, the second liquid can be comprised of deionized water.

After the first liquid is displaced with the second liquid, layer 150 is exposed to a third liquid. The third liquid displaces the second liquid from between layers 150 and 130. The step of exposing layer 150 to the third liquid can be performed in the acid hood. In the preferred embodiment, the second liquid is miscible in the third liquid. As an example, the third liquid can be comprised of hydrogen peroxide. The step of exposing layer 150 to the third liquid can be eliminated when the first liquid is comprised of hydrogen peroxide.

After the second liquid is displaced by the third liquid, layer 150 is exposed to a fourth liquid. This fourth liquid displaces the third liquid from between layers 150 and 130. This step of exposing layer 150 to the fourth liquid can be performed in the acid hood. In the preferred embodiment, the third liquid is miscible in the fourth liquid. As an example, the fourth liquid can be comprised of deionized water. Also in the preferred embodiment, the second and fourth liquids are the same so that a single liquid is provided for the second and fourth liquids. The step of exposing layer 150 to the fourth liquid can be eliminated when the first liquid is comprised of hydrogen peroxide.

After the third liquid is displaced by the fourth liquid, layer 150 is exposed to a fifth liquid. The fifth liquid displaces the fourth liquid from between layers 150 and 130. The step of exposing layer 150 to the fifth liquid can be performed in the acid hood. In the preferred embodiment, the fifth liquid is inorganic, preferably does not etch or corrode any component of 100, and is also miscible in carbon dioxide. As an example, the fifth liquid can be comprised of carboxylic acid. An example of a suitable type of carboxylic acid is acetic acid, particularly glacial or non-diluted acetic acid.

After the fourth liquid is displaced by the fifth liquid, component 100, and in particular layers 130 and 150, are supercritical dried with carbon dioxide. This supercritical drying process includes the use of liquid carbon dioxide. Liquid carbon dioxide is in injected at a high pressure and at a temperature below the supercritical temperature of carbon dioxide into a pressure vessel containing component 100. The liquid carbon dioxide is flowed though the pressure vessel to displace the fifth liquid from between layers 150 and 130. After the fifth liquid is substantially removed, the pressure vessel is heated to above the supercritical temperature. After the pressure vessel and its contents are above the supercritical temperature, the pressure in the vessel is reduced gradually to atmospheric pressure. Then, the pressure vessel is opened, and the dry component is removed from the pressure vessel.

Figure 4:
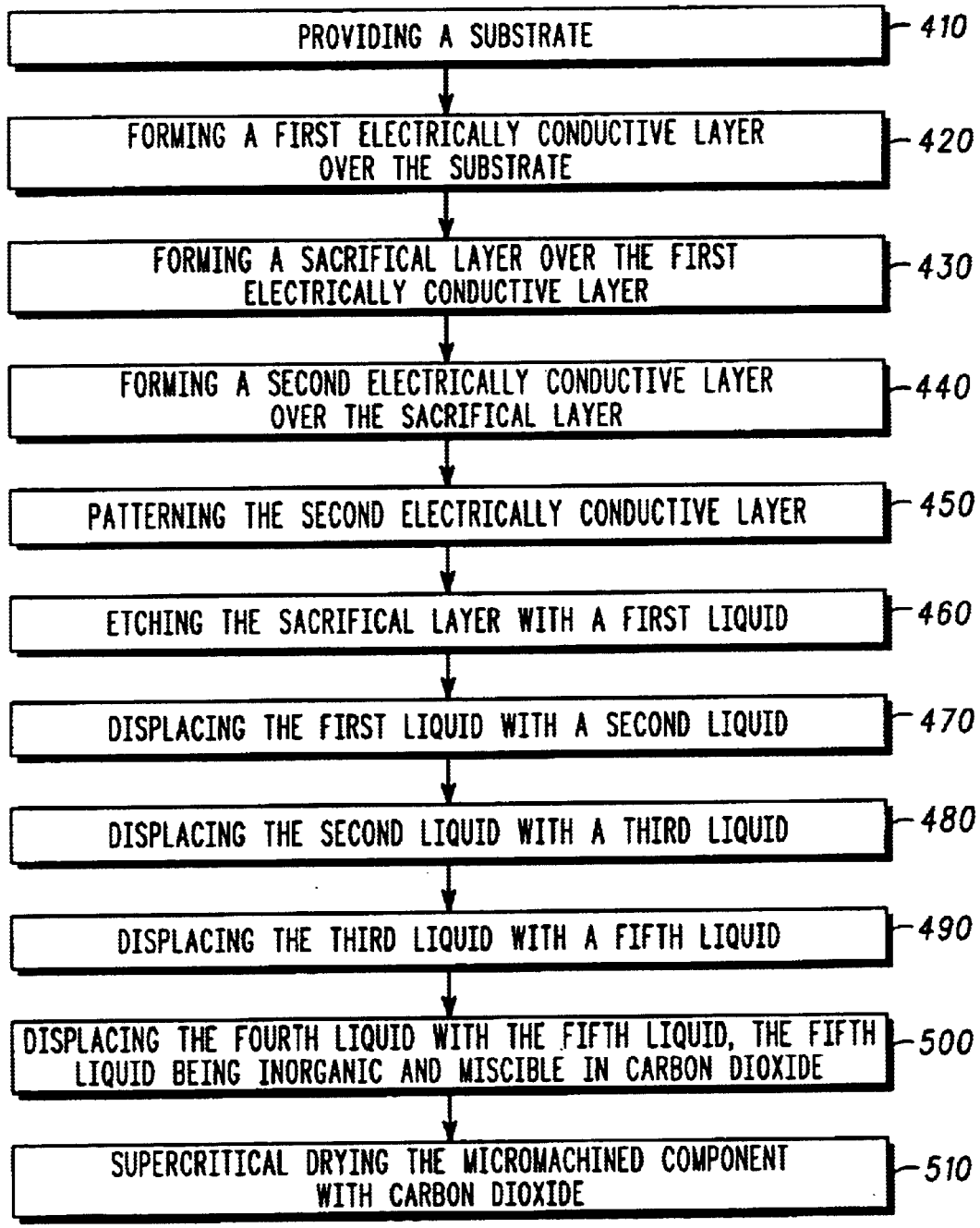
FIG. 4 illustrates a flow chart of a method of manufacturing a micromachined component in accordance with an embodiment of the invention.

FIG. 4 illustrates a flow chart 400 of a method of manufacturing a micromachined component such as component 100 of FIGS. 1 through 3. At a step 410 of flow chart 400, a substrate is provided. As an example, the substrate can be similar to substrate 110 of FIGS. 1 through 3.

Next, at a step 420 of flow chart 400 in FIG. 4, a first electrically conductive layer is formed over the substrate. As an example, the first electrically conductive layer can be similar to layer 130 of FIGS. 1 through 3.

Then, at a step 430 in flow chart 400 of FIG. 4, a sacrificial layer is formed over the first electrically conductive layer. As an example, the sacrificial layer can be similar to layer 140 of FIGS. 1 and 2.

Subsequently, at a step 440 of FIG. 4, a second electrically conductive and/or structural layer is formed over the sacrificial layer. As an example, the second electrically conductive and/or structural layer can be similar to layer 150 of FIGS. 1 through 3.

Next, at a step 450 of flow chart 400 in FIG. 4, the second electrically conductive and/or structural layer is patterned. The patterning of the second electrically conductive and/or structural layer exposes portions of the sacrificial layer to permit the subsequent removal of the sacrificial layer.

Then at a step 460 in flow chart 400 of FIG. 4, the second electrically conductive and/or structural layer is removed. The sacrificial layer is etched with a first liquid that is preferably a non-solvent.

Subsequently, at a step 470 of FIG. 4, the first liquid is displaced with a second liquid. As an example, the component can be immersed in the second liquid, or the second liquid can be sprayed onto the component. Step 470 is used to rinse the micromachined component before subsequent processing.

Next, at an optional step 480 of FIG. 4, the second liquid is displaced with a third liquid. As an example, the component can be immersed in the third liquid, or the third liquid can be sprayed onto the component. Step 480 is used to form a stable surface chemistry on the exposed surfaces of the component.

Subsequently, at an optional step 490 of FIG. 4, the third liquid is displaced with a fourth liquid. As an example, the component can be immersed in the fourth liquid, or the fourth liquid can be sprayed onto the component. Step 490 is used to rinse the micromachined component before subsequent processing.

Next, at a step 500 of FIG. 4, the fourth liquid is displaced with a fifth liquid. In an embodiment of flow chart 400 where optional steps 480 and 490 are not performed, step 500 is altered to displace the second liquid with the fifth liquid. The fifth liquid is inorganic and is preferably miscible in carbon dioxide. Step 500 is used to prepare the micromachined component for a subsequent drying process. As an example, the component can be immersed in the fifth liquid, or the fifth liquid can be sprayed onto the component.

In the preferred embodiment, step 500 is performed for approximately five minutes or at least for a sufficiently long enough time to preferably completely remove the fourth liquid. If step 500 is performed by using a static bath of the fifth liquid, the time required for step 500 can increase. If step 500 is performed using a recirculating or agitated bath of the fifth liquid, the time can be decreased.

Next, at a step 510 of FIG. 4, the micromachined component is supercritical dried, preferably using carbon dioxide. The carbon dioxide displaces the fifth liquid.

Therefore, an improved micromachined component and method of manufacture is provided to overcome the disadvantages of the prior art. The method of manufacturing the micromachined component does significantly increase the manufacturing throughput and also keeps the manufacturing costs low while eliminating or at least reducing release stiction.

Although the invention has been described with reference to specific embodiments, it will be understood by those skilled in the art that various changes may be made without departing from the spirit or scope of the invention. For instance, the numerous details set forth herein such as, for example, the material and liquid compositions are provided to facilitate the understanding of the invention and are not provided to limit the scope of the invention. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A method of manufacturing a micromachined component comprising:
    using a first liquid to etch a first layer located underneath a second layer;
    exposing the second layer to a second liquid after using the first liquid, the second liquid being inorganic and miscible in carbon dioxide, the second liquid including an organic component selected from the group consisting of carboxylic acid, acetic acid, and glacial acetic acid; and
    supercritical drying the micromachined component with carbon dioxide after exposing the second layer to the second liquid.

2. The method of claim 1 further comprising:
    forming the first layer comprised of silicon dioxide, and providing the first liquid comprised of hydrofluoric acid.

3. The method of claim 1 further comprising:
    forming the first layer comprised of germanium, and providing the first liquid comprised of hydrogen peroxide.

4. The method of claim 1 further comprising:
    forming the first layer comprised of a polymer, and providing the first liquid comprised of an organic solvent.

5. A method of claim 1 further comprising:
    exposing the second layer to a third liquid after using the first liquid and before exposing the second layer to the second liquid.

6. The method of claim 5 further comprising:
    providing the first liquid miscible in the third liquid.

7. The method of claim 5 further comprising:
    exposing the second layer to a fourth liquid after exposing the second layer to the third liquid and before exposing the second layer to the second liquid.

8. The method of claim 7 further comprising:
    providing the first liquid miscible in the third liquid; and providing the third liquid miscible in the fourth liquid.

9. The method of claim 7 further comprising:
    exposing the second layer to a fifth liquid after exposing the second layer to the fourth liquid and before exposing the second layer to the second liquid.

10. The method of claim 9 further comprising:
    providing the first liquid miscible in the third liquid;
    providing the third liquid miscible in the fourth liquid;
    providing the fourth liquid miscible in the fifth liquid; and
    providing the fifth liquid miscible in the second liquid.

11. The method of claim 9, wherein the second liquid and the fourth liquid comprise a single liquid.

12. A method of manufacturing a micromachined component comprising:
    using a first liquid to etch a first layer located underneath a second layer;
    exposing the second layer to a second liquid after using the first liquid, the second liquid being inorganic and miscible in carbon dioxide, wherein the second liquid comprises carboxylic acid; and
    supercritical drying the micromachined component with carbon dioxide after exposing the second layer to the second liquid.

13. A method of manufacturing a micromachined component comprising:
    using a first liquid to etch a first layer located underneath a second layer;
    exposing the second layer to a second liquid after using the first liquid, the second liquid being inorganic and miscible in carbon dioxide, wherein the second liquid comprises acetic acid; and
    supercritical drying the micromachined component with carbon dioxide after exposing the second layer to the second liquid.

14. A method of manufacturing a micromachined component comprising:
    using a first liquid to etch a first layer located underneath a second layer;
    exposing the second layer to a second liquid after using the first liquid, the second liquid being inorganic and miscible in carbon dioxide, wherein the second liquid comprises glacial acetic acid; and
    supercritical drying the micromachined component with carbon dioxide after exposing the second layer to the second liquid.

* * * * *

UNITED STATES PATENT AND TRADEMARK OFFICE
CERTIFICATE OF CORRECTION

PATENT NO. : 6,811,714 B1 Page 1 of 1
APPLICATION NO. : 09/680777
DATED : November 2, 2004
INVENTOR(S) : Jonathan F. Gorrell et al.

It is certified that error appears in the above-identified patent and that said Letters Patent is hereby corrected as shown below:

Column 6, Line 7, Claim No. 5:

Change "A" to --The--

Signed and Sealed this

Third Day of June, 2008

JON W. DUDAS
*Director of the United States Patent and Trademark Office*